(12) United States Patent
Fan et al.

(10) Patent No.: US 7,927,768 B2
(45) Date of Patent: Apr. 19, 2011

(54) ALIGNMENT MARK OF MASK

(75) Inventors: Chih-Shen Fan, Hsinchu (TW); Li-Wei Chen, Hsinchu (TW); I-Chin Sung, Tainan (TW); Fa-Cheng Wang, Taipei (TW)

(73) Assignee: VisEra Technologies Company Limited, Hsinchu (TW)

( * ) Notice: Subject to any disclaimer, the term of this patent is extended or adjusted under 35 U.S.C. 154(b) by 280 days.

(21) Appl. No.: 12/244,380

(22) Filed: Oct. 2, 2008

(65) Prior Publication Data

US 2010/0086194 A1    Apr. 8, 2010

(51) Int. Cl.
*G03F 9/00*    (2006.01)

(52) U.S. Cl. .............................................. 430/5; 430/22
(58) Field of Classification Search .................. 430/5, 22
See application file for complete search history.

(56) References Cited

U.S. PATENT DOCUMENTS

2005/0151473 A1 *   7/2005   Wan et al. ..................... 313/582

* cited by examiner

*Primary Examiner* — Christopher G Young
(74) *Attorney, Agent, or Firm* — Muncy, Geissler, Olds & Lowe, PLLC

(57) ABSTRACT

A lithography mask is disclosed, comprising an alignment mark, including a first bar, a second bar crossing the first bar, and a specific pattern having different signatures with the first and second bars connecting to the second bar.

20 Claims, 11 Drawing Sheets

ALIGNMENT MARK OF MASK

BACKGROUND OF THE INVENTION

1. Field of the Invention

This invention relates to a photolithography aligner system, and more particularly relates to alignment marks designed for aligner systems.

2. Description of the Related Art

For the manufacturing process of integrated circuits, the lithography process is one of the most important processes. The quality of the lithography process is evaluated by critical dimensions and alignment accuracy. Besides the performance of the alignment system and the accuracy of metrology, the alignment marks on the mask and wafer is another factor that affects the alignment accuracy. Circuit accuracy is profoundly affected by the alignment marks, especially when process error happens.

FIGS. 1A-1C show an alignment procedure using a conventional aligner system. First, referring to FIG. 1A, charge coupled devices (CCD, not shown) of the aligner system search the cross shaped alignment marks 104 on a mask and are aligned thereto. Referring to FIG. 1B, charge coupled devices of the aligner system search the alignment mark 102 on a wafer and are aligned thereto. After the charge coupled devices find positions of the alignment marks 102 and 104 on the mask and the wafer, as shown in FIG. 1C, the aligner system aligns the cross shaped alignment mark 104 on the mask to the alignment mark 102 on the wafer and then performs an exposure step.

FIGS. 2A-2C show a general error occurring on a conventional aligner system. Since fabrication processes for a product typically includes multiple steps, sometimes previously used exposed patterns are left on the wafers. For example, the patterns formed by exposing a negative resist may be left on the wafer. Specifically, referring to FIG. 2A, the cross patterns 202 formed by previous steps are left on the wafer. Therefore, when the charge coupled devices try to find the alignment marks 206 on the mask, some errors occur because the charge coupled devices mistakenly assume the cross shaped alignment mark 202 on the wafer as the alignment mark 206 on the mask, but the charge coupled devices indeed are not aligned to the alignment mark 206 on the mask. Referring to FIG. 2B, charge coupled devices of the aligner system search the alignment mark 204 on a wafer and are aligned thereto. Next, as shown in FIG. 2C, the aligner system aligns the cross shaped alignment mark 206 on the mask to the alignment mark 204 on the wafer and then performs an exposure step. However, since the charge coupled devices did not find the real positions of the alignment mark 206 on the mask, there is deviation in the exposure. Therefore, a method to eliminate the above mentioned deficiencies is needed.

BRIEF SUMMARY OF INVENTION

According to the issues described, the invention provides a lithography mask, comprising an alignment mark, including a first bar, a second bar crossing the first bar, and a specific pattern having different signatures with the first and second bars connecting to the second bar.

The invention also provides an alignment procedure. A wafer comprising an alignment mark is provided. A mask comprising an alignment mark is provided, wherein the alignment mark of the mask includes a first bar, a second bar crossing the first bar and a specific pattern having different signatures with the first and second bars connecting to the second bar. A first layer exposing step is performed with the alignment mark of the mask aligned to the alignment mark of the wafer. A second layer exposing step is performed with the alignment mark of the mask rotated 90° and aligned to the alignment mark of the wafer.

The invention further provides a method for verifying alignment accuracy. A wafer comprising an alignment mark is provided. A mask comprising an alignment mark is provided, wherein the alignment mark of the mask includes a first bar, a second bar crossing the first bar and a specific pattern having different signatures with the first and second bars connecting to the second bar. A shift amount between the specific pattern of the alignment mark on the mask and the alignment mark on the wafer is measured to verify alignment accuracy.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense, not for limiting the invention.

Figure 1A:
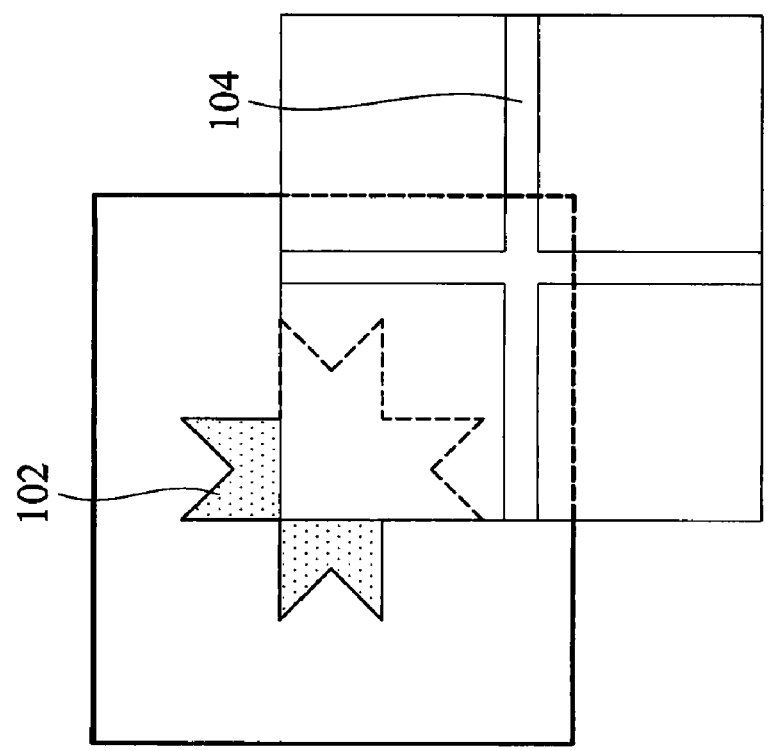
FIGS. 1A-1C show an alignment procedure using a conventional aligner system.
Figure 1A:
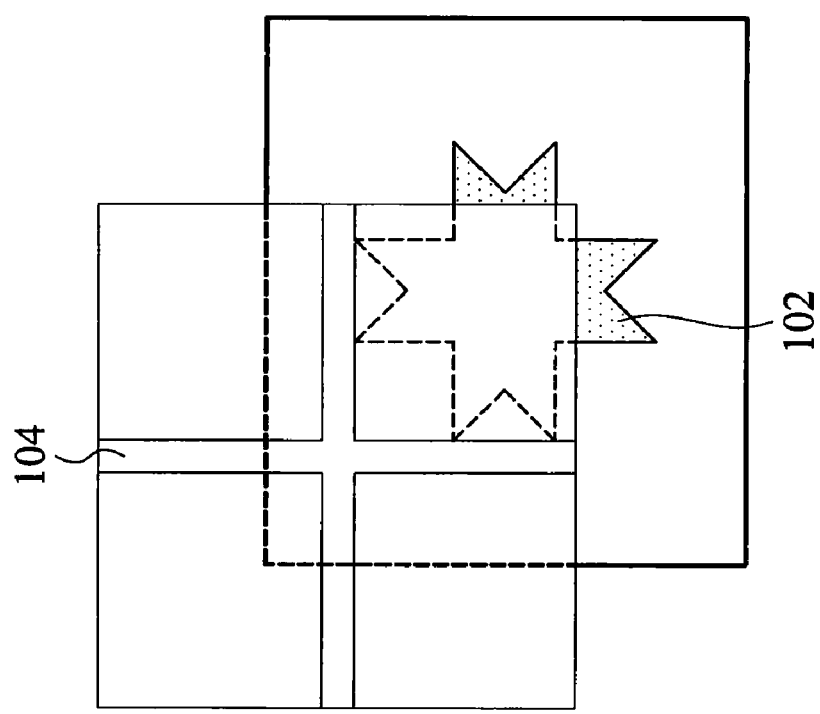
Figure 1B:
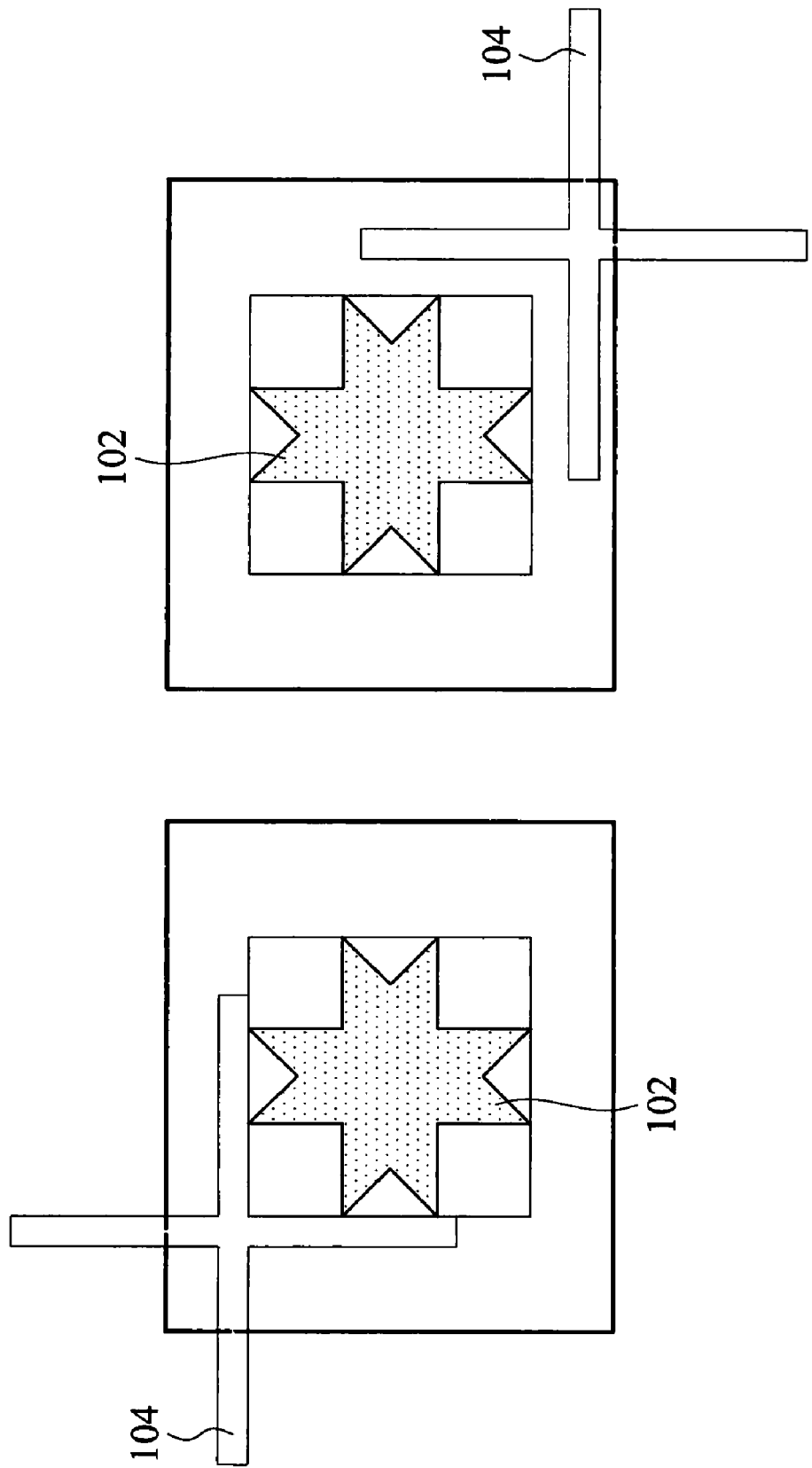
Figure 1C:
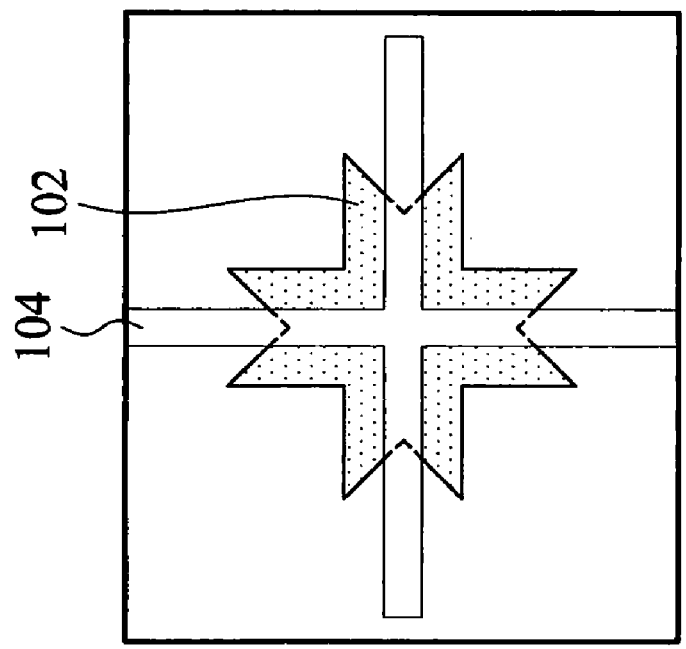
Figure 1C:
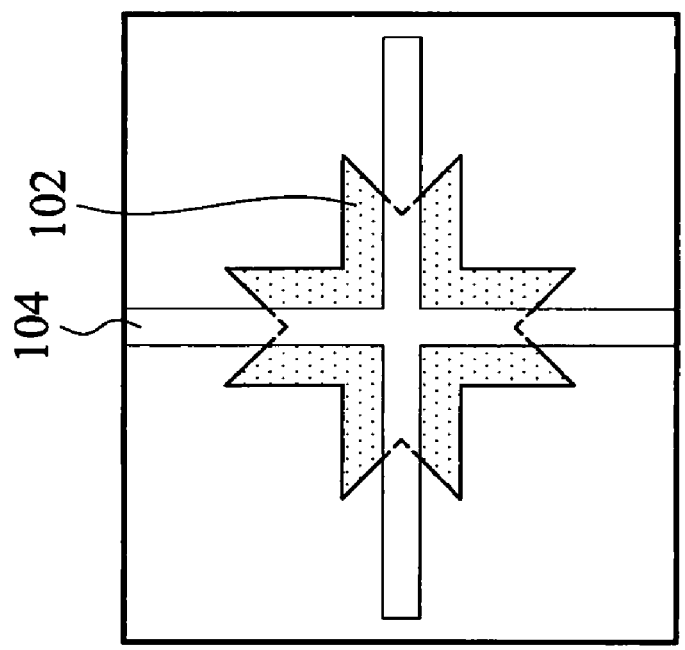
Figure 2A:
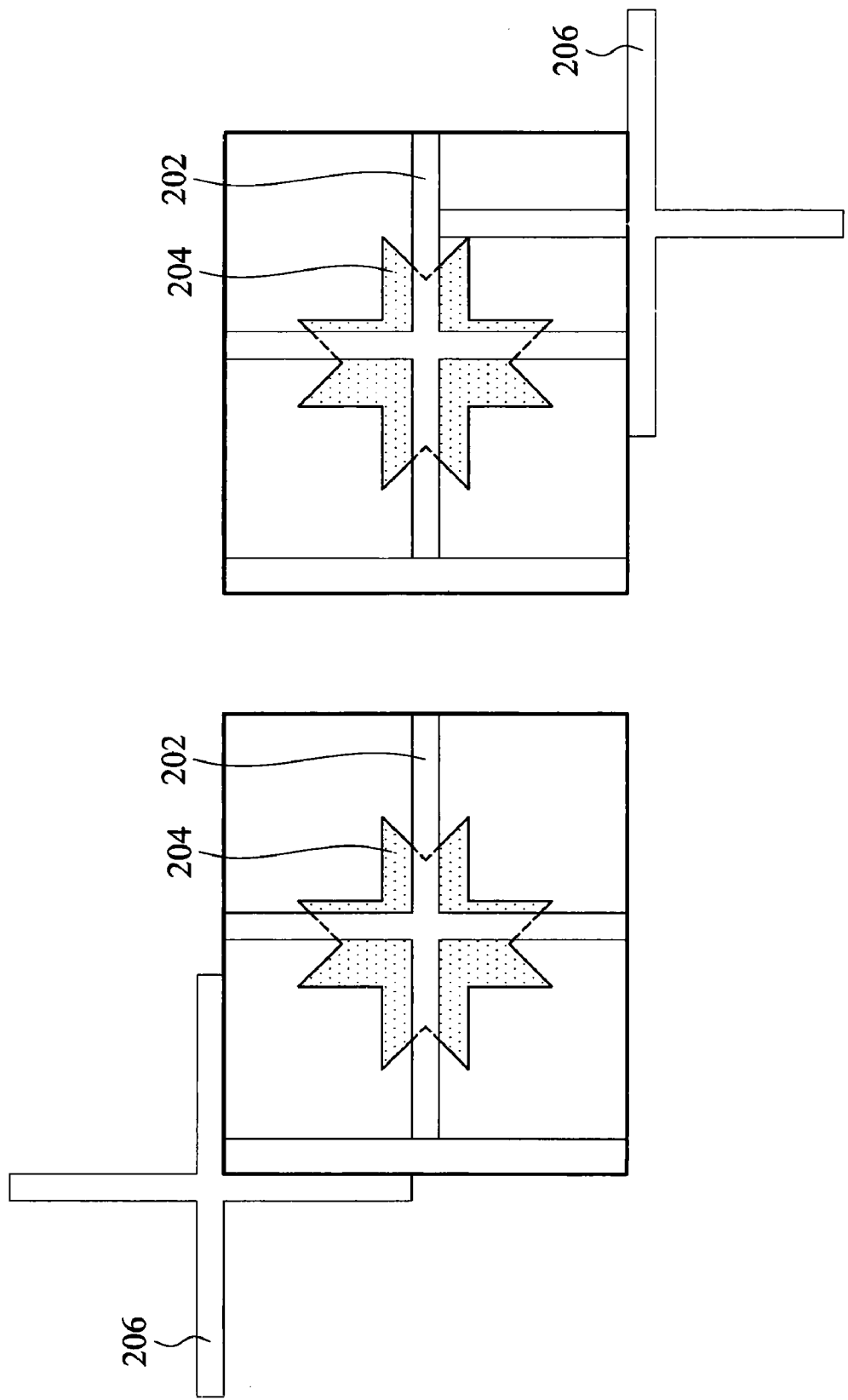
FIGS. 2A-2C show a general error occurring on a conventional aligner system.
Figure 2B:
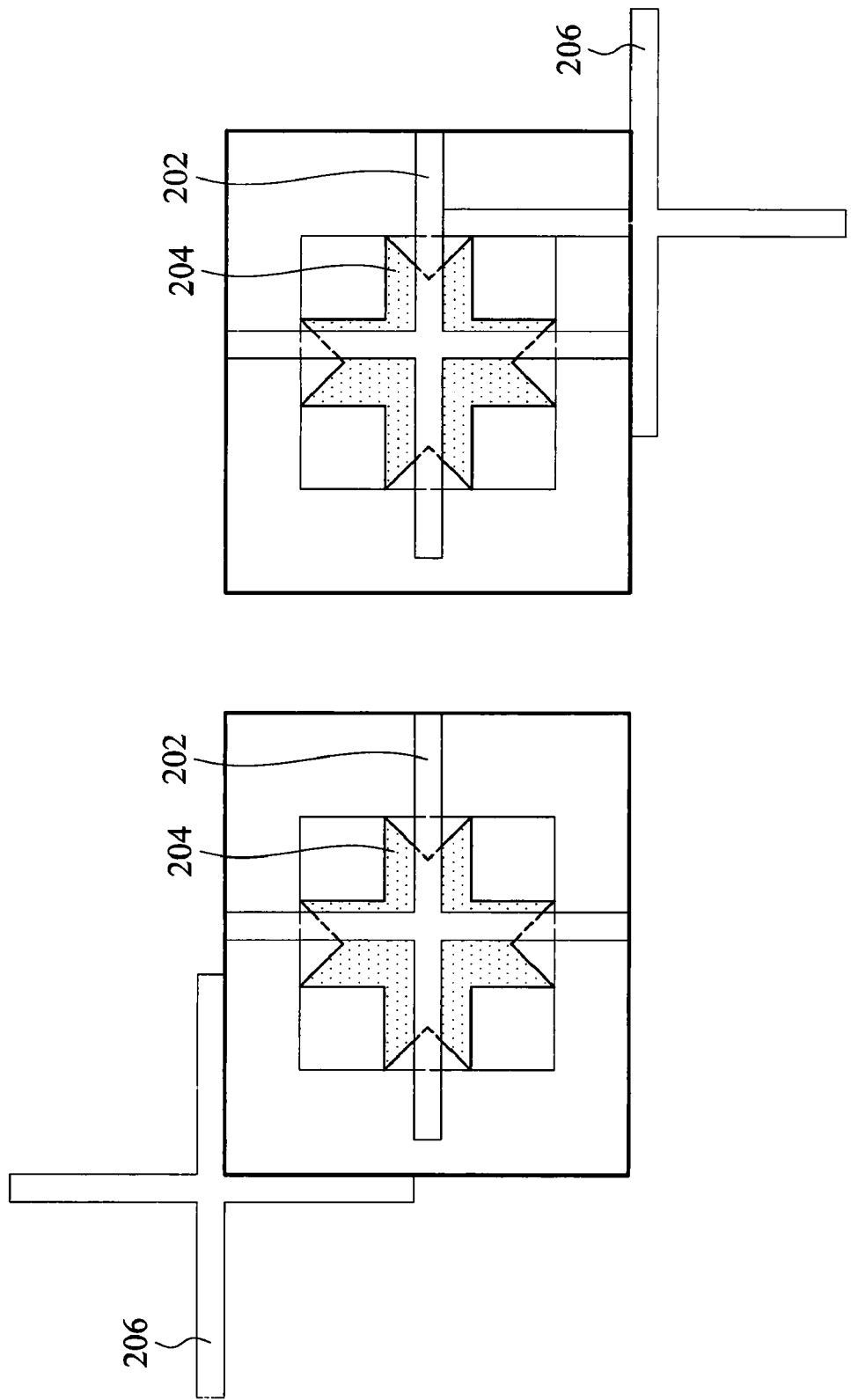
Figure 2C:
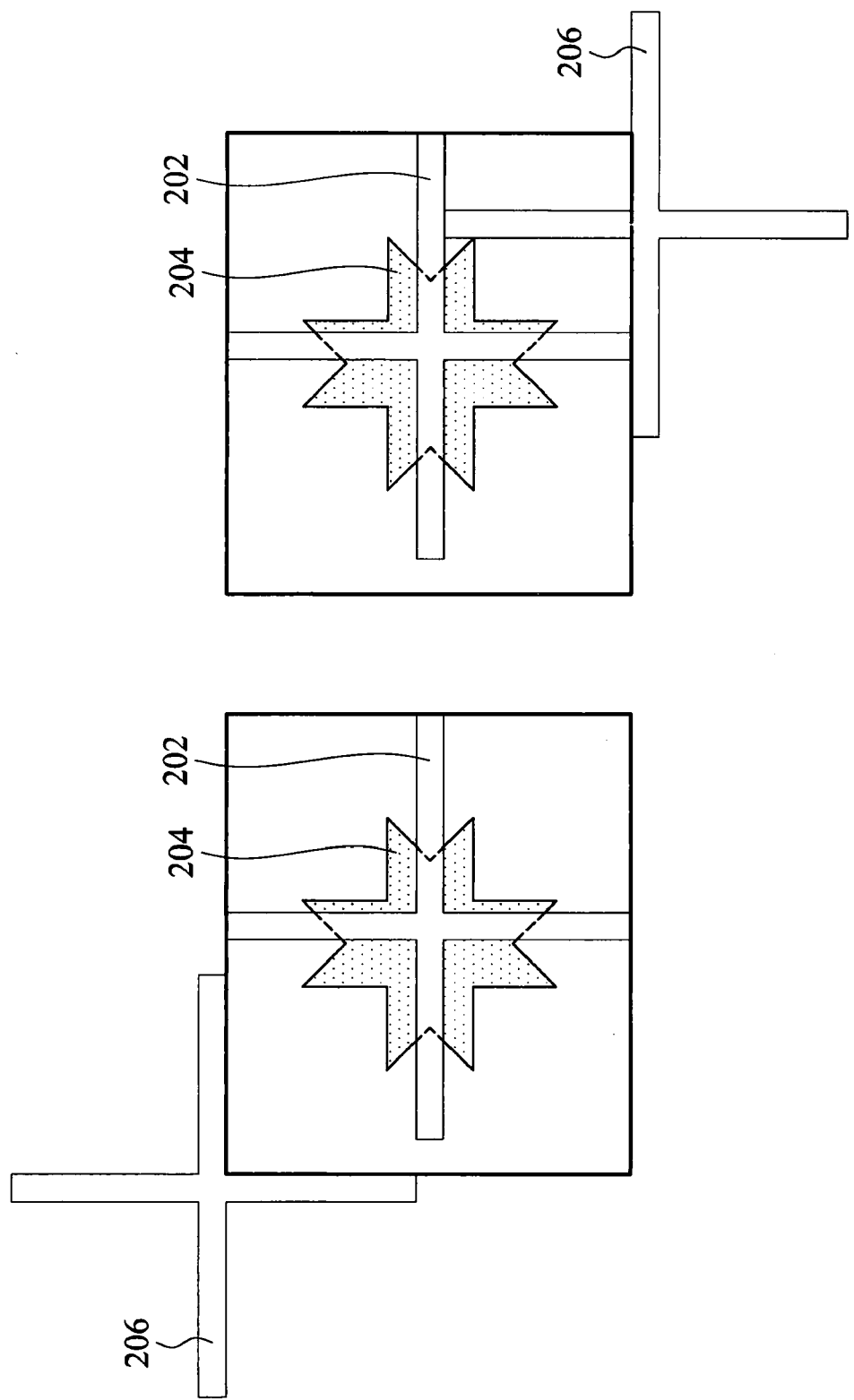
Figure 3A:
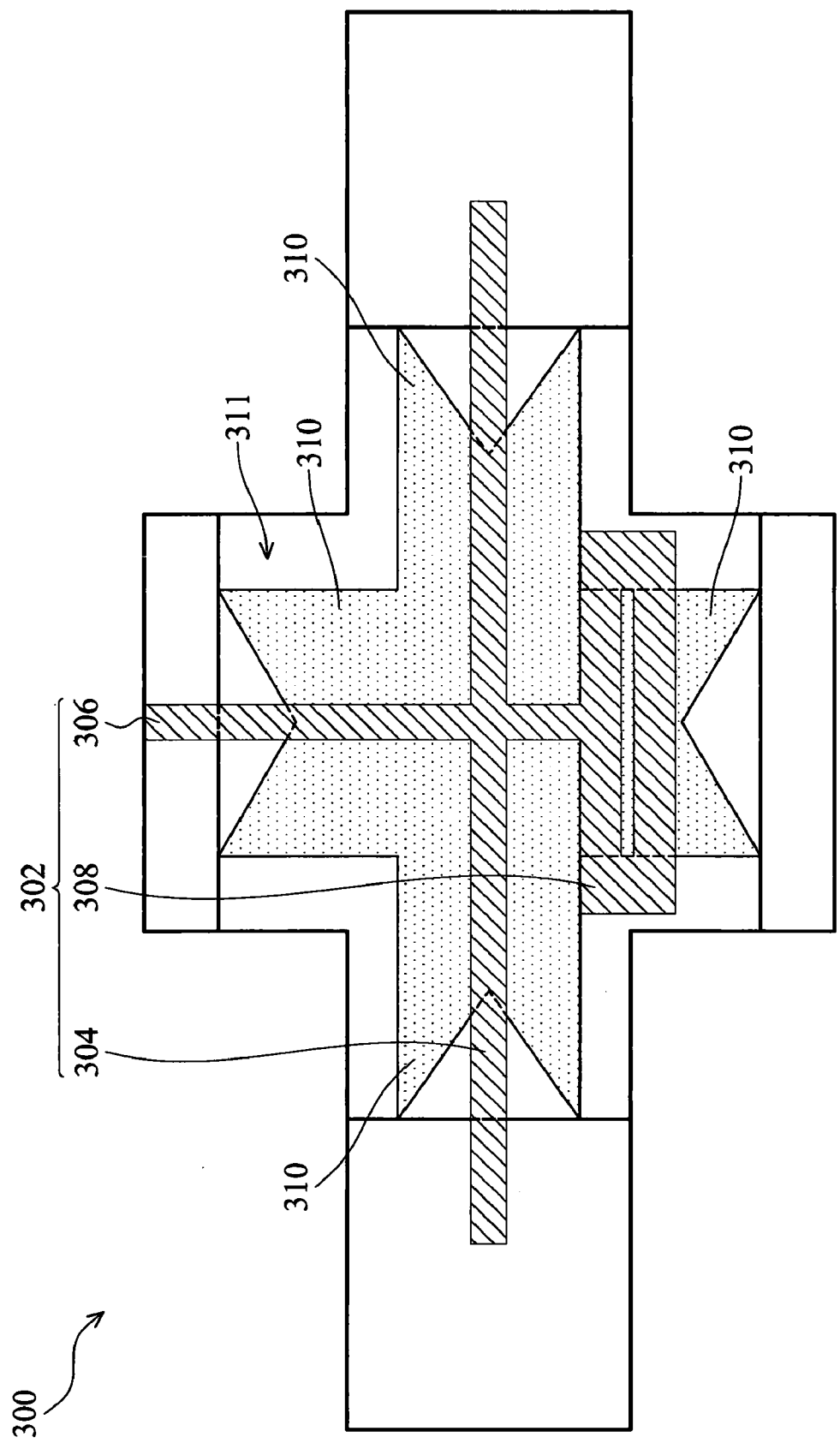
FIG. 3A shows an alignment mark on a lithography mask of an embodiment of the invention.
Figure 3B:
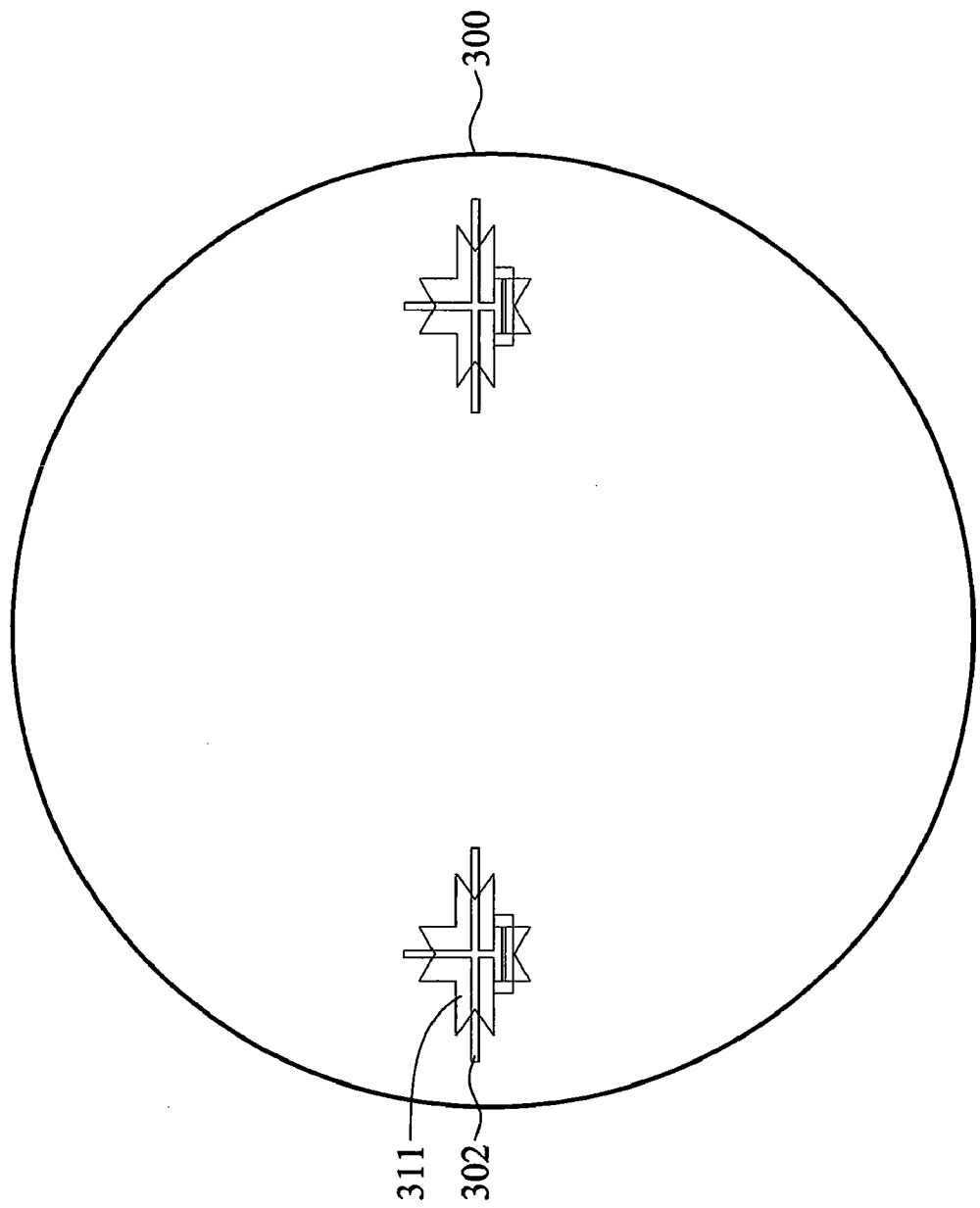
FIG. 3B shows positions of alignment marks of an embodiment of the invention.

FIG. 3A shows an alignment mark on a lithography mask of an embodiment of the invention, and it is noted that the alignment mark is specifically suitable for a one time (1×1) lithography mask used in an aligner. The alignment mark 302 includes a first bar 304, a second bar 306 crossing the first bar 304 and a specific pattern 308 having different signatures with the first and second bars 304, 306 connecting to the second bar 306. In more detail, as shown in FIG. 3A, the specific pattern 308 is a hollow square pattern with a hollow region. The specific pattern 308 has a sufficient density for identification by the lithography system to avoid interference from patterns left by previous lithography steps. Therefore, the designed alignment mark 302 on the lithography mask can eliminate exposure deviations in conventional methods due to previously left patterns. For example, an alignment procedure using the alignment mark of the embodiment of the invention is disclosed in accordance with FIG. 3. A wafer 300 comprising an alignment mark 311 is provided and the alignment mark 311 is a pattern including four scissors-shaped portions 310 extending in four directions in the embodiment. The mask comprising the alignment mark 302 with a first bar 304, a second bar 306 and a hollow square pattern 308 is provided. Next, a first layer exposing step is performed with the alignment mark 302 of the mask aligned to the alignment mark 311 of the wafer 300. A second layer exposing step is then performed with the alignment mark 302 of the mask rotated 90° and aligned to the alignment mark 302 of the wafer 300. Since the alignment mark 302 of the mask rotates, the second layer exposing step is not interfered with by patterns left during the first layer exposing step, because the lithography apparatus can identify that the rotated alignment mark 302 of the mask is different from the pattern left during the first layer exposing step according to the hollow square pattern 308. Further, the embodiment can perform a third layer exposing step with the alignment mark 302 of the mask rotated 900 again and aligned to the alignment mark 302 of the wafer 300, and perform a fourth layer exposing step with the alignment mark 302 of the mask further rotated 90° and aligned to the alignment mark 302 of the wafer 300. Accordingly, the alignment mark 302 of the mask can be reused at least four times. As shown the FIG. 3B, the alignment marks 302 of the embodiment preferably correspond to two opposite edges of the wafer 300.

The lithography apparatus of the embodiment can check aligning accuracy with the specific alignment mark 302 of the mask. Referring to FIG. 3A, in an example of the invention, the first bar 304 has a length of 200 μm and a width of 10 μm, the second bar 306 has a length of 125 μm and a width of 10 μm, the hollow square pattern 308 has a length of 70 μm and width of 25 μm and the two opposite edges of the hollow region are aligned to the edges of the scissors-shaped pattern 310 of the alignment mark 302 on the wafer 300. Therefore, when the alignment mark 302 on the mask shifts with respect to the alignment mark 302 on the wafer 300, the shift amount can be obtained by measuring the distance between the hollow square pattern 308 of the alignment mark 302 on the mask and the scissors-shaped pattern 310 of the alignment mark 302 on the wafer 300.

Figure 4:
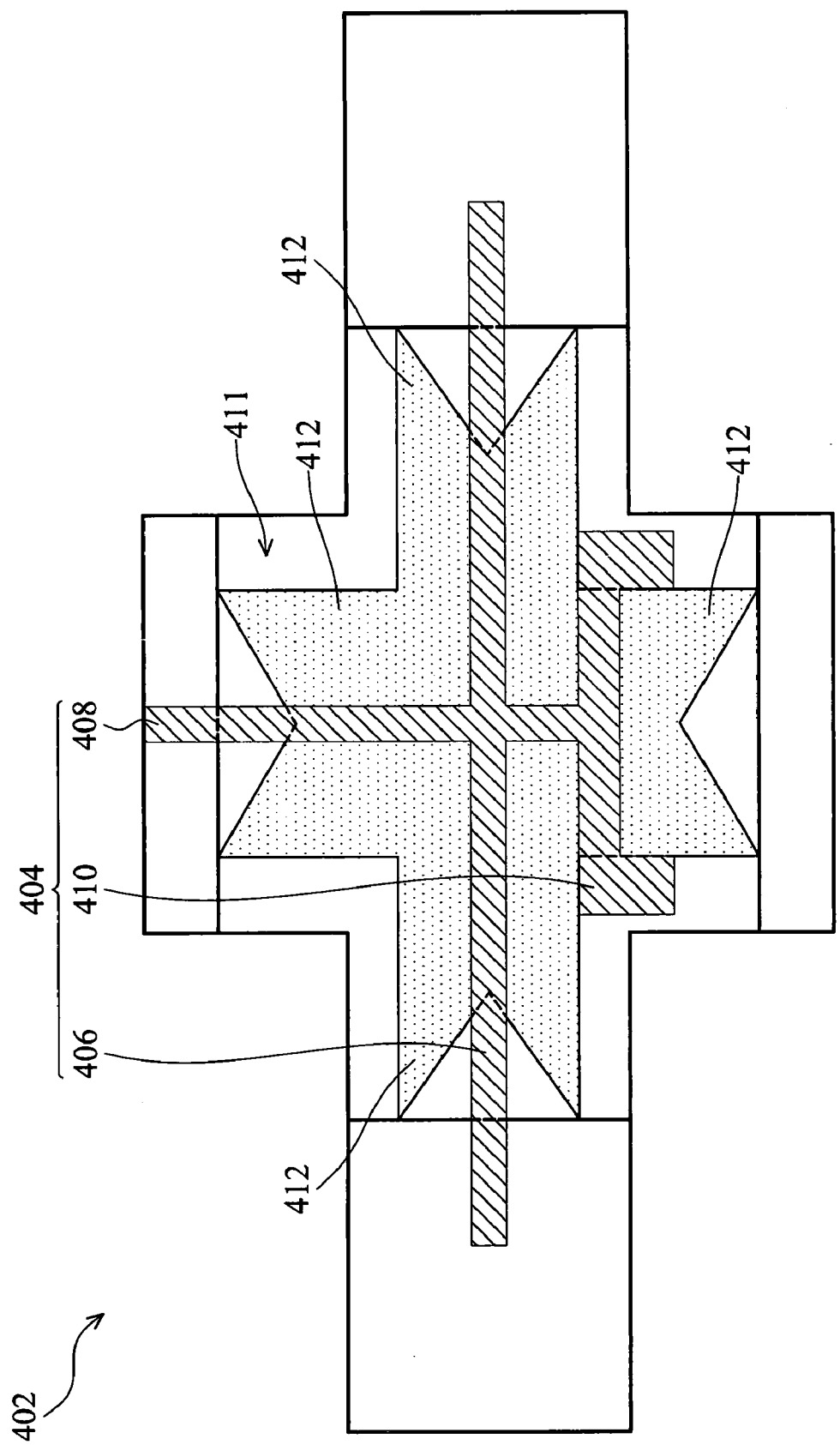
FIG. 4 shows an alignment mark on a lithography mask of another embodiment of the invention.

FIG. 4 shows an alignment mark on a lithography mask of another embodiment of the invention. For simplicity, the like portions of the embodiment shown in FIG. 4 to FIG. 3 are not described in this paragraph, and only the different portions are described. While the specific pattern is a hollow square in the alignment mark 404 of the mask shown in FIG. 3, the specific pattern 410 of the alignment mark 404 on the mask is an upside-down U-shaped pattern. The alignment mark 404 on the mask with the upside-down U-shaped pattern 410 connected to the second bar 408 can also eliminate exposure deviations in conventional methods due to previously left patterns and can be reused four times. Further, the lithography apparatus of the embodiment can also check aligning accuracy with the alignment mark. In a example of the invention, the first bar 406 has a length of 200 μm and a width of 10 m, the second bar 408 has a length of 125 μm and a width of 10 μm, the upside-down U-shaped pattern 410 has a length of 70 μm and width of 25 μm and two opposite inner edges of the upside-down U-shaped pattern 410 are aligned to the outer edges of the scissors-shaped pattern 412 of the alignment mark on the wafer 402. Therefore, when the alignment mark 404 on the mask shifts with respect to the alignment mark 411 on the wafer 402, the shift amount can be obtained by measuring the distance between the upside-down U-shaped pattern 410 of the alignment mark 404 on the mask and the scissors-shaped pattern 412 of the alignment mark 411 on the wafer 402.

Figure 5:
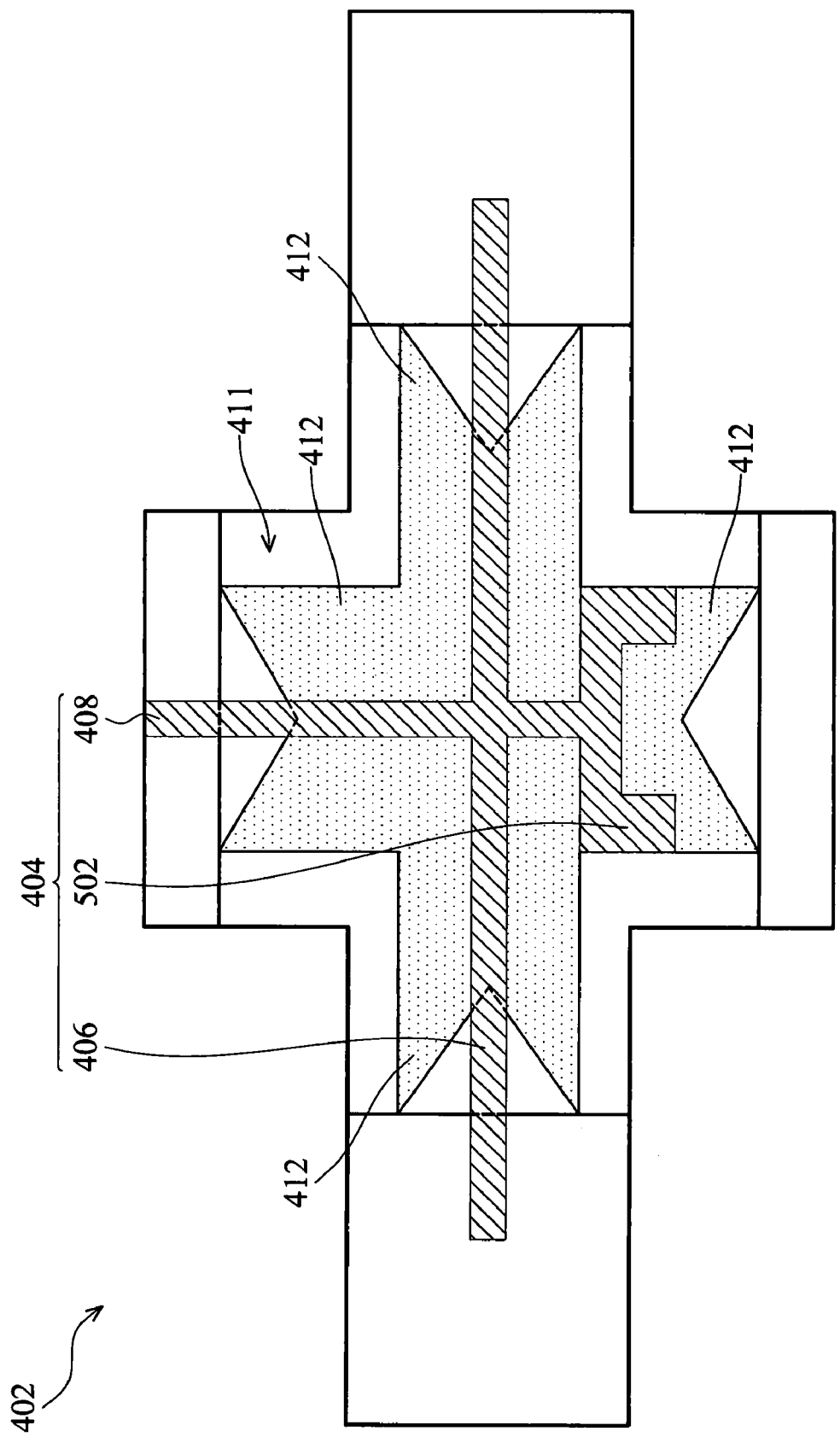
FIG. 5 shows an alignment mark on a lithography mask of another embodiment of the invention.

FIG. 5 shows an alignment mark on a lithography mask of another embodiment of the invention. For simplicity, the like portions of the embodiment shown in FIG. 5 to FIG. 4 are not described in this paragraph, only the different portions are described with the same symbols used for like portions. While the inner edge of the upside-down U-shaped pattern is aligned to the outer edges of the scissors-shaped pattern of the alignment mark on the mask shown in FIG. 3, the specific pattern 502 of the alignment mark 404 on the mask is a upside-down U-shaped pattern with an inner edge aligned to the outer edges of the scissors-shaped pattern 412 of the alignment mark 411 on the wafer 402. In an example of the invention, the first bar 406 has a length of 200 μm and a width of 10 μm, the second bar 408 has a length of 70 μm and a width of 10 μm, the upside-down U-shaped pattern 502 has length of 50 μm and width of 25 μm and it is noted that two opposite outer edges of the upside-down U-shaped pattern 502 are aligned to the outer edges of the scissors-shaped pattern 412 of the alignment mark 411 on the wafer 402. Therefore, when the alignment mark 404 on the mask shifts with respect to the alignment mark 411 on the wafer 402, the shift amount can be obtained by measuring the distance between the upside-down U-shaped pattern 502 of the alignment mark 404 on the mask and the scissors-shaped pattern 412 of the alignment mark 411 on the wafer 402.

Figure 6:
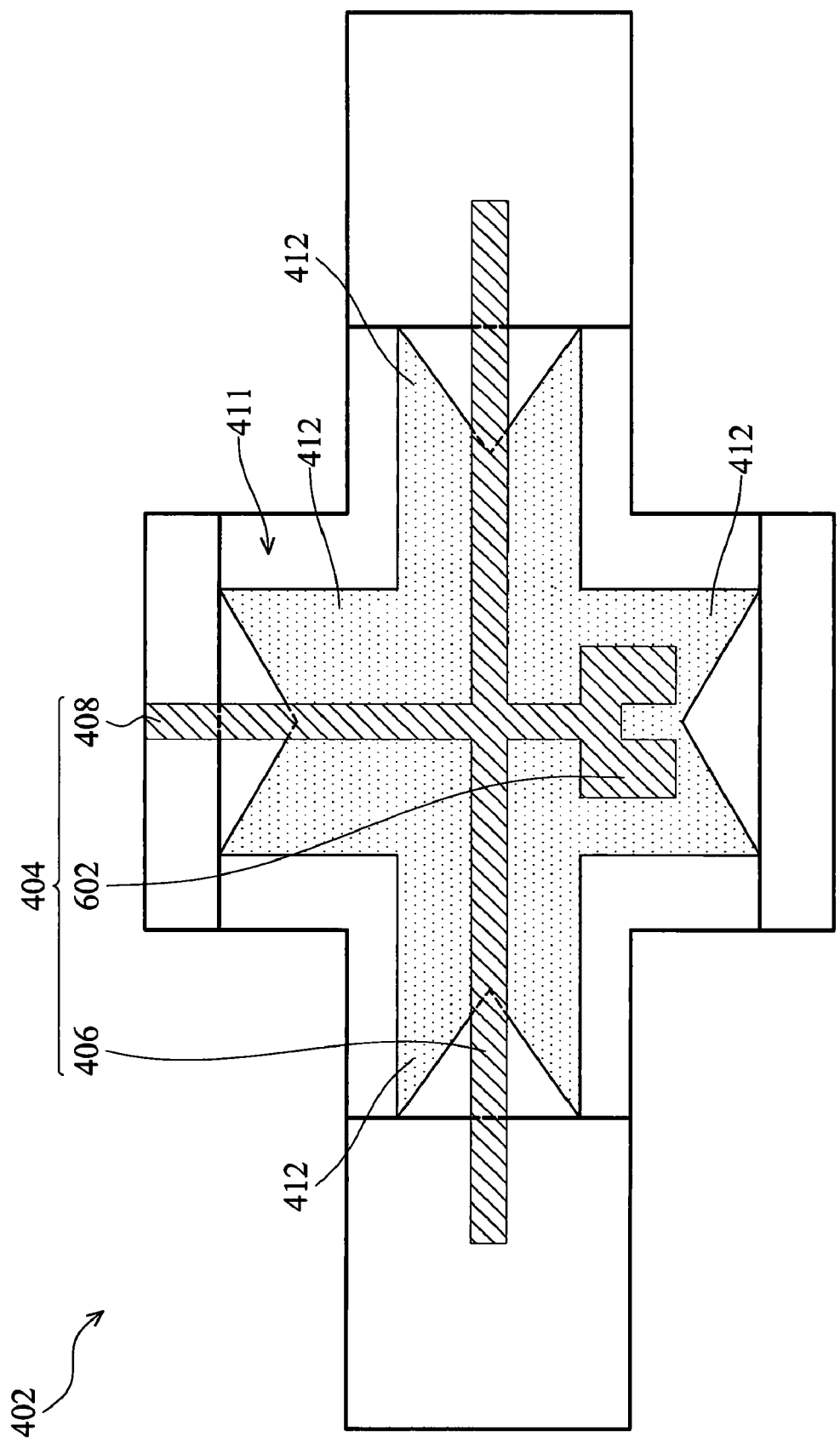
FIG. 6 shows an alignment mark on a lithography mask of further another embodiment of the invention.

FIG. 6 shows an alignment mark on a lithography mask of further another embodiment of the invention. For simplicity, the like portion of the embodiment shown in FIG. 5 to FIG. 4 are not described in this paragraph, and only the different portions are described with the same symbols used for like portions. While the outer edge of the upside-down U-shaped pattern is aligned to the outer edges of the scissors-shaped pattern of the alignment mark on the mask shown in FIG. 5, the specific pattern 602 of the alignment mark 404 on the mask is an upside-down U-shaped pattern 602 with a smaller size. In more detail, the length of the upside-down U-shaped pattern 602 in this embodiment is ⅗ that of that shown in FIG. 5. In a example of the invention, the first bar 406 has a length of 200 μm and a width of 10 μm, the second bar 408 has a length of 70 μm and a width of 10 μm, the upside-down U-shaped pattern 602 have length of 3 μm and width of 25 μm and it is noted the upside-down U-shaped pattern 602 is within the area of scissors-shaped pattern 412 of the alignment mark on the wafer 402. When the alignment mark 404 on the mask shifts with respect to the alignment mark 411 on the wafer 402, the shift amount can also be obtained by measuring the distance between the upside-down U-shaped pattern 602 of the alignment mark 411 on the mask 404 and the scissors-shaped pattern 412 of the alignment mark 411 on the wafer 402.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lithography mask, comprising:
   an alignment mark, including:
   a first bar;
   a second bar crossing the first bar; and
   a specific pattern having different signatures with the first and second bars connecting to the second bar.

2. The lithography mask as claimed in claim 1, wherein the specific pattern is a hollow square.

3. The lithography mask as claimed in claim 1, wherein the specific pattern is an upside-down U-shaped pattern.

4. The lithography mask as claimed in claim 1, wherein the alignment mark on the lithography mask is for aligning an alignment mark on a wafer.

5. The lithography mask as claimed in claim 4, wherein the alignment mark on the wafer is a pattern including four scissors-shaped portions extending in four directions.

6. The lithography mask as claimed in claim 5, wherein the specific pattern is an upside-down U-shaped pattern having an inner edge aligned to an outer edge of one of the scissors-shaped portions of the alignment mark on the wafer.

7. The lithography mask as claimed in claim 5, wherein the specific pattern is an upside-down U-shaped pattern having an outer edge aligned to an outer edge of one of the scissors-shaped portions of the alignment mark on the wafer.

8. The lithography mask as claimed in claim 5, wherein the specific pattern is an upside-down U-shaped pattern and the upside-down U-shaped pattern is within the area of the scissors-shaped portion.

9. The lithography mask as claimed in claim 1, wherein the lithography mask is a one time (1×1) mask used in an aligner.

10. An alignment procedure, comprising:
providing a wafer comprising an alignment mark;
providing a mask comprising an alignment mark, wherein the alignment mark of the mask includes:
a first bar;
a second bar crossing the first bar; and
a specific pattern having different signatures with the first and second bars connecting to the second bar;
performing a first layer exposing step with the alignment mark of the mask aligned to the alignment mark of the wafer; and
performing a second layer exposing step with the alignment mark of the mask rotated 90° and aligned to the alignment mark of the wafer.

11. The alignment procedure as claimed in claim 10, wherein the specific pattern is a hollow square.

12. The alignment procedure as claimed in claim 10, wherein the specific pattern is an upside-down U-shaped pattern.

13. The alignment procedure as claimed in claim 10, wherein the alignment mark on the wafer is a pattern including four scissors-shaped portions extending in four directions.

14. The alignment procedure as claimed in claim 13, wherein the specific pattern is an upside-down U-shaped pattern having an inner edge aligned to an outer edge of one of the scissors-shaped portions of the alignment mark on the wafer.

15. The alignment procedure as claimed in claim 13, wherein the specific pattern is an upside-down U-shaped pattern having an outer edge aligned to one of the scissors-shaped portions of the alignment mark on the wafer.

16. The alignment procedure as claimed in claim 13, wherein the specific pattern is an upside-down U-shaped pattern within the area of the scissors-shaped portion.

17. The alignment procedure as claimed in claim 10, wherein the mask is a one time (1×1) mask used in an aligner.

18. The alignment procedure as claimed in claim 10, further comprising performing a third layer exposing step with the alignment mark of the mask rotated 90° and aligned to the alignment mark of the wafer.

19. The alignment procedure as claimed in claim 10, further comprising performing a fourth layer exposing step with the alignment mark of the mask rotated 90° and aligned to the alignment mark of the wafer.

20. A method for verifying alignment accuracy, comprising:
providing a wafer comprising an alignment mark;
providing a mask comprising an alignment mark, wherein the alignment mark of the mask includes:
a first bar;
a second bar crossing the first bar; and
a specific pattern having different signatures with the first and second bars connecting to the second bar; and
measuring a shift amount between the specific pattern of the alignment mark on the mask and the alignment mark on the wafer.

* * * * *